United States Patent
Kittl et al.

(10) Patent No.: US 6,204,132 B1
(45) Date of Patent: Mar. 20, 2001

(54) METHOD OF FORMING A SILICIDE LAYER USING AN ANGLED PRE-AMORPHIZATION IMPLANT

(75) Inventors: Jorge A. Kittl; Christopher Bowles, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/306,494

(22) Filed: May 6, 1999

Related U.S. Application Data

(60) Provisional application No. 60/084,474, filed on May 6, 1998.

(51) Int. Cl.$^7$ .................................................. H01L 21/336
(52) U.S. Cl. .......................... 438/299; 438/525; 438/664; 438/683
(58) Field of Search .................................... 438/525, 664, 438/682, 683, 299

(56) References Cited

U.S. PATENT DOCUMENTS 4,943,728 * 7/1990 Dykstra et al. .................... 250/492.3
5,223,445 * 6/1993 Fuse .

OTHER PUBLICATIONS

H. Ito, M. Sasaki, N. Kimizuka, J. Uwasawa, N. Nakamura, T. Ito, Y. Goto, A. Tsuboi, S. Watanuki, T. Ueda, and T. Horiuchi, Gate Electrode Microstructure Having Stacked Large–Grain Poly–Si with Ultra–Thin $SiO_x$ Interlayer for Reliability in Sub–Micrometer CMOS. IEDM 97–635. 0–7803–4100–7/97. IEEE. pp. 26.3.1–26.3–4.

Jiunn–Yann Tsai, Stanley W.–C. Yeh. Device Degradation Associated with Pre–Amorphization Implant (PAI) of the Ti Salicide Process. 1997 International Symposium on VLSI Technology, Systems, and Applications, Proceedings of Technical Papers, Jun. 3–5, 1997, pp. 28–33.

* cited by examiner

Primary Examiner—Long Pham
(74) Attorney, Agent, or Firm—Mark A. Valetti; Wade James Brady, III; Frederick J. Telecky, Jr.

(57) ABSTRACT

An embodiment of the instant invention is a method of making a transistor having a silicided gate structure insulatively disposed over a semiconductor substrate which lies in an x-y plane, the method comprising the steps of: forming a semiconductive structure insulatively disposed over the semiconductor substrate (step 302 of FIG. 3); amorphizing a portion of the conductive structure by introducing an amorphizing substance into the semiconductive structure at an angle, theta, which is greater than seven degrees from a z-axis which is normal to the semiconductor substrate (step 310 of FIG. 3); forming a metal layer on the conductive structure (step 312 of FIG. 3); and wherein the metal layer interacts with the semiconductive structure in the amorphized portion of the conductive structure so as to form a lower resistivity silicide on the conductive structure (step 314 of FIG. 3). Preferably, the semiconductive structure is comprised of a material selected from the group consisting of: doped polysilicon, undoped polysilicon, epitaxial silicon, and any combination thereof; and the metal layer is comprised of a material selected from the group consisting of: titanium, Co, W, Mo, nickel, platinum, palladium, and any combination thereof.

20 Claims, 3 Drawing Sheets

METHOD OF FORMING A SILICIDE LAYER USING AN ANGLED PRE-AMORPHIZATION IMPLANT

This application claims priority under 35 USC §1 19(e)(1) of provisional application No. 60/084,474 filed May 6, 1998.

CROSS-REFERENCE TO RELATED PATENT/PATENT APPLICATIONS

The following commonly assigned patent/patent applications are hereby incorporated herein by reference:

| Patent No./Serial No. | Filing Date |
| --- | --- |
| 09/087,411 | May 29, 1998 |
| 09/110,034 | July 2, 1998 |
| 09/306,185 | May 6, 1999 |

The above noted applications were filed and claim priority based upon provisional applications Serial No. 60/048,143, filed May 30, 1997, Serial No. 60/051,725, filed Jul. 3, 1997 and Serial No. 60/084,816, filed May 8, 1998, respectively.

FIELD OF THE INVENTION

The instant invention pertains to semiconductor device fabrication and processing and more specifically to a method of forming a silicide region.

BACKGROUND OF THE INVENTION

Titanium silidde has become the most widely-used silicide in the VLSI industry for self-aligned silicide applications because of its combined characteristics of low resistivity, the ability to be self-aligned, and relatively good thermal stability. Although $TiSi_2$ has certain advantages relative to other silicides, the fact that it is a polymorphic material presents additional problems in its use. Specifically, in typical use $TiSi_2$ exists as either an orthorhombic base-centered phase having 12 atoms per unit cell and a resistivity of about 60–90 micro-ohm-cm (known in the industry as the C49 phase), or as a more thermodynamically-favored orthorhombic face-centered phase which has 24 atoms per unit cell and a resistivity of about 12–20 micro-ohm-cm (known as the C54 phase). When using the generally-accepted processing conditions for forming titanium silicide, the less-desirable, higher-resistivity C49 phase is formed first. In order to obtain the lower-resistivity C54 phase, a second high-temperature annealing step is required.

A typical set of processing conditions for forming C54 phase titanium silicide include: (1) pre-cleaning, (2) titanium deposition, (3) silicide formation at a temperature about 700° C. or below, (4) selective etching, and (5) a phase transformation anneal at a temperature greater than about 700° C. It is the phase transformation anneal that converts the dominant C49 phase to the C54 phase. The initial formation temperature is kept about 700° C. or below in order to minimize over-spacer bridging. The second transformation anneal is performed after any un-reacted titanium has been selectively removed and is generally performed at temperatures of 50°–200° C. above the formation temperature to insure full transformation to the C54 phase for best control of sheet resistance. However, as device line-widths and silicide film thickness continue to be scaled down, the C49 to C54 transformation becomes more difficult on these narrow structures (such as narrow gate structures) due to the low C54 nucleation density.

It is generally accepted that the C49 phase forms first because of a lower surface energy than that of the C54 phase. In other words, the higher surface energy of C54 phase forms a higher energy barrier to its formation. The second transformation anneal step used in the standard process above provides the additional thermal energy necessary to both overcome the nucleation barrier associated with forming the new surface and growing the crystalline structure of the newly-forming C54 phase. In VLSI applications, if the phase transformation is inhibited or fails to occur uniformly, a degradation in circuit performance is observed. In some higher-performance circuits, the RC delay associated with a poor phase transformation is typically about 5–10 percent.

A significant limitation on the C49-to-C54 phase transformation is a phenomenon known as agglomeration. If the thermal energy used to obtain the phase transformation is excessive, then a morphological degradation of the titanium silicide results, which is commonly referred to as agglomeration. As line-widths and silicide film thickness decrease, the thermal energy required to affect the C49 -to- C54 phase transformation increases, yet the thermal energy level at which the silicide film starts to agglomerate decreases. Thus, there is an ever-shrinking process window for performing this phase transformation, making process control and uniformity more difficult to achieve.

Thus, there is a need for an improved method for forming the C54 phase titanium silicide.

One solution to this problem involves causing at least a portion of the polycrystalline silicon structure to become amorphous. This can be done by subjecting the polycrystalline silicon structure to preamorphization implant (PAI) prior to the deposition of titanium. As is described in a prior patent application assigned to Texas Instruments, Ser. No. 09/110,034 , this PAI can be accomplished by implanting either Ge or As into the polycrystalline structure so as to make it amorphous for at least 10 to 30 nm into the structure.

A problem with this method is that a fairly small percentage of the transistors formed using this method fail. More specifically, some devices will have an on-current versus off-current that is dramatically different from an average device.

SUMMRY OF THE INVENTION

Basically, the instant invention involves a method of performing a PAI which eliminates or reduces the amount of PAI dopant which penetrates through the layer to be silicided (such as a polycrystalline silicon gate structure) and into an underlying dielectric layer (such as a gate dielectric layer) or semiconductor layer (such as a silicon substrate). Preferably, this is accomplished by performing the PAI step at an implantation angle of seven degrees or greater, from the direction perpendicular to the substrate active surface (the surface of the substrate on which the components of the circuit are fabricated), while the wafer is rotated in the x-y plane. This rotation may either be continuously performed as the implantation is done or in discrete steps.

An embodiment of the instant invention is a method of making a transistor having a silicided gate structure insulatively disposed over a semiconductor substrate which lies in an x-y plane, the method comprising the steps of: forming a semiconductive structure insulatively disposed over the semiconductor substrate; amorphizing a portion of the conductive structure by introducing an amorphizing substance into the semiconductive structure at an angle, theta, which is greater than seven degrees from a z-axis which is normal to the semiconductor substrate; forming a metal layer on the conductive structure; and wherein the metal layer interacts with the semiconductive structure in the amorphized portion of the conductive structure so as to form a lower resistivity silicide on the conductive structure. Preferably, the semiconductive structure is comprised of a material selected from the group consisting of: doped polysilicon, undoped polysilicon, epitaxial silicon, and any combination thereof; and the metal layer is comprised of a material selected from the group consisting of: titanium, Co, W, Mo, nickel, platinum, palladium, and any combination thereof.

In an alternative embodiment, a low temperature anneal step is performed after the step of forming a metal layer on the gate structure. Preferably, the low temperature anneal step is comprised of subjecting the transistor to temperatures in excess of 600 C., and, more preferably, it is comprised of subjecting the transistor to a temperature around 700 to 800 C.

The amorphizing substance is, preferably, comprised of a substance selected from the group consisting of: As, Ge, or any combination thereof. The angle, theta, may be given by:

$$\text{theta} > \arctan(L/d)$$

or by $$7° < \text{theta} \leq \arctan(L'/2d)$$

where L is the gate length of the transistor, d is the thickness of the semiconductive structure, and L' is the distance from the edge of one gate structure to the edge of the closest gate structure. Preferably, the angle, theta, is around 25 degrees. The semiconductor substrate is, preferably, rotated in the x-y plane during the step of introducing the amorphizing substance into the semiconductor structure. Preferably, the semiconductor substrate is continuously rotated in the x-y plane during the step of introducing the amorphizing substance into the semiconductor structure, or it is rotated in discrete steps. The step size may be around 90 degrees, or it may be around 45 degrees.

Another embodiment of the instant invention is a method of siliciding a structure comprised of a semiconductive material situated over a semiconductor substrate, the method comprising the steps of: amorphizing a portion of the semiconductive material by introducing an amorphizing substance into the semiconductive material at an angle, theta, which is greater than seven degrees from a z-axis which is normal to the semiconductor substrate; forming a metal layer on the semiconductive material; and wherein the metal layer interacts with the semiconductive material in the amorphized portions of the semiconductive material so as to form a silicide on the semiconductive material. Preferably, the semiconductive structure is comprised of a material selected from the group consisting of: doped polysilicon, undoped polysilicon, epitaxial silicon, and any combination thereof; and the metal layer is comprised of a material selected from the group consisting of: titanium, Co, W, Mo, nickel, platinum, palladium, and any combination thereof. The amorphizing substance is, preferably, comprised of a substance selected from the group consisting of: As, Ge, or any combination thereof. The angle, theta, is, preferably, determined by:

$$7° < \text{theta} \leq \arctan(L'/2d)$$

where L' is the distance from the edge of one structure to the edge of the closest structure, and d is the height of the semiconductive material.

DETAILED DESCRIPTION OF THE DRAWINGS

While the following description of the instant invention revolves around FIGS. 4a–4f, the instant invention can be utilized in any semiconductor device structure. The instant invention is applicable to the formation of any silicide region. While the preferred silicide enhancing substance is molybdenum, other materials such as Co, W, Ta, Nb, Ru, or Cr can be used. The preferred amorphizing substance to introduce into the silicon-containing layer or substrate, preferably accomplished by a preamorphization implant ("PAI"), is either Ge or As, but any substance/element can be used so that it causes the silicon-containing layer or substrate to become amorphous for at least 10 to 30 nm into the layer or substrate. In addition, while the preferred silicide material is titanium, other materials such as Co, W, Mo, nickel, platinum, and palladium may be used.

Before discussing the details of the different embodiments of the method of the instant invention, it is important to discuss the discovery of the problem solved by the named inventors of the instant application. PAI is primarily used to more easily form low-resistive titanium silicide. This becomes particularly important in structures (particularly gate structures) that are small in one (e.g. width) or both (e.g. width and length) dimensions because the formation of the necessary grain structure of the silicide is impeded by these small dimensions.

Figure 1A:
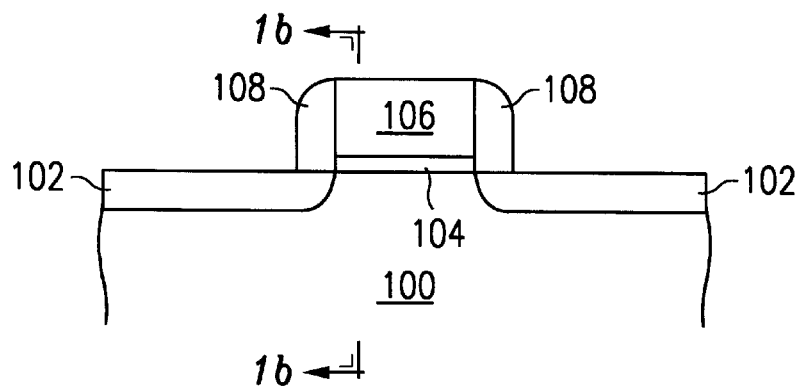
FIG. 1a is a cross-sectional view of a partially fabricated transistor.
Figure 1B:
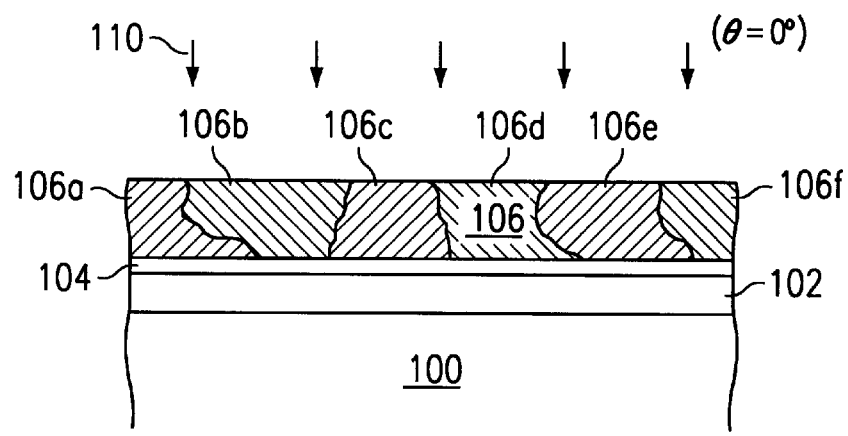
FIG. 1b is also a cross-sectional view of the transistor of FIG. 1a but along the 1b—1b line.

However, as was discovered by the named inventor of this application, standard PAI methodology is flawed because such methodology results in a portion of transistors formed using this method to have $I_{on}$ versus $I_{off}$ characteristics which are different than those for an average device. After extensive experimentation and research, the named inventor of the instant application discovered that using the standard PAI methodology (which utflizes an implant method where the dopants are introduced at a fixed angle, typically, perpendicular to the plane of the substrate—θ=0 degrees, or within a few degrees of this direction $-0 \leq \theta < 7$ degrees, φ fixed) causes some of the dopants to pass through the polycrystalline silicon layer 106 (FIG. 1b) in regions where the crystal planes are parallel to the incident ion beam (see regions 106c and 106f of FIG. 1b). While there is a very small number of grains of the material to be silicided (preferably polycrystalline silicon or single crystal silicon) for the which the crystal planes will be aligned such that the PAI dopant will pass through it and into an underlying structure which will be adversely altered (such as an underlying channel region), it will happen on a limited number of transistors and that is not acceptable in most cases.

Figure 3:
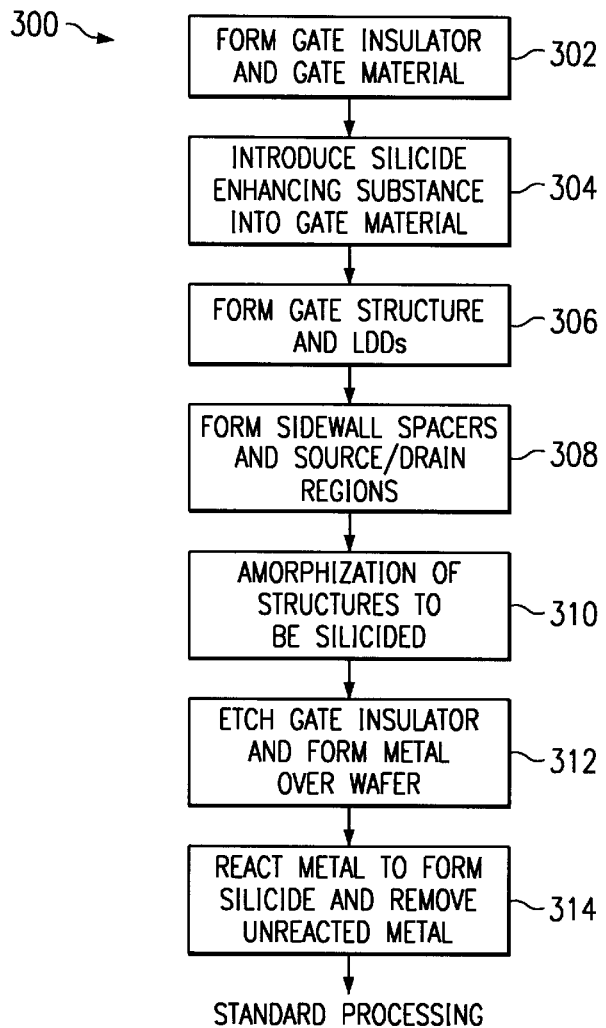
FIG. 3 is a flow chart illustrating the method of one embodiment of the instant invention.
Figure 4A:
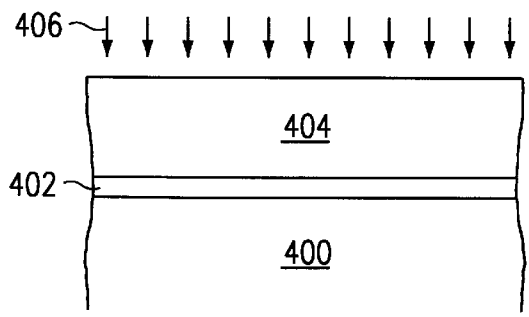
FIGS. 4a–4f are cross-sectional views illustrating the processing of a device using the method of the instant invention illustrated in FIG. 3.

The following description of the method of the instant invention will revolve around FIGS. 3 and 4a–4f. Referring to FIGS. 3 and 4a, substrate 400 is provided and a gate dielectric is formed on substrate 400 (step 302). Gate dielectric 402 may be comprised of an oxide, thermally grown $SiO_2$, a nitride, an oxynitride, or any combination thereof, and is preferably on the order of 2 to 10 nm thick. In step 302, silicon-containing layer 404 is formed on gate dielectric 402. Preferably, layer 404 is comprised of polycrystalline silicon ("poly" or "polysilicon"), but layer 404 may be comprised of epitaxial silicon or any other semiconducting material. Next, a dopant is introduced into layer 404 so as to increase the conductivity of layer 404. This is preferably followed by an anneal step so as to drive the dopant into layer 404. Alternatively, the dopant may be introduced when the source/drain regions are doped, instead of being doped at this point.

Either before or after the dopant is introduced into layer 404 and the anneal step is performed, a silicide enhancing substance 406 is, optionally, introduced into layer 404 (step 304). The purpose of this material is to aid in the formation of C54 phase silicide on layer 404. Preferably, the silicide enhancing substance is comprised of Mo, Ta, or other refractory metals. However, as stated above, this substance may be comprised of many different elements or a combination of elements. More specifically, the silicide enhancing substance is preferably a substance that promotes the formation of C54 phase silicidation of a later deposited metal. Most likely this means that when the subsequent metal layer is deposited on layer 404 (which has the silicide enhancing substance, if it is utilized, at the upper most surface) it will either form the C54 phase silicide directly or will more readily transform from the C49 phase to the C54 phase in a following anneal step.

Preferably, the silicide enhancing substance, if it is utilized, is implanted into layer 404 using ion implantation. However, this substance may also be introduced into or on layer 404 by depositing the substance onto layer 404 (preferably by PVD or CVD). Preferably, the source of the silicide enhancing substance, if used, is solid molybdenum or Ta and the concentration of the substance in layer 404 is around $10^{19}$ to $10^{20}$ atoms/cm$^3$. The implant energy of the moly is preferably around 35 keV and the moly dose is preferably around $1 \times 10^{13}$ to $5 \times 10^{14}$ atoms/cm$^2$. Furthermore, step 304 may be performed after the gate material is etched (so as to form the gate structure) in step 306. Alternatively, the silicide enhancing substance (preferably moly), if this is used at all, may be introduced after step 308 or after step 310.

Figure 4B:
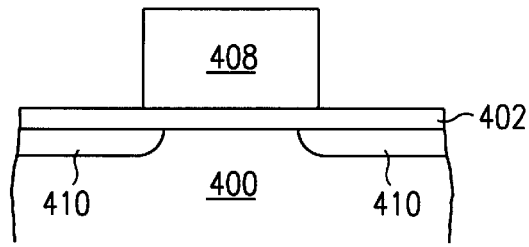

Referring to FIGS. 3 and 4b, in step 306 a pattern (not shown) is formed on layer 404 and portions of layer 404 are removed so as to form gate structure 408. Preferably this is accomplished by an anisotropic etch step, but one of ordinary skill in the art will know how to perform these patterning and etch steps. In step 306, implants for lightly doped drains 410 are performed (if at all). This is a standard processing step for both PMOS and NMOS structures.

Figure 4C:
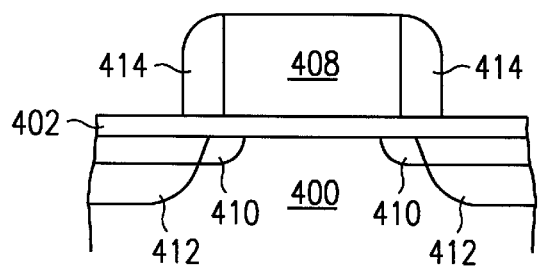

Referring to FIGS. 3 and 4c, in step 308, sidewall spacers 414 are formed. Preferably, sidewall spacers are comprised of oxygen, nitrogen or a combination of the two. Next, source/drain regions 412 are preferably formed by implanting boron, phosphorous, and/or arsenic into the substrate and performing an anneal step (shown as region 416 in FIG. 4d). Step 308 is a standard processing step in DRAM and logic device process flows.

Figure 2:
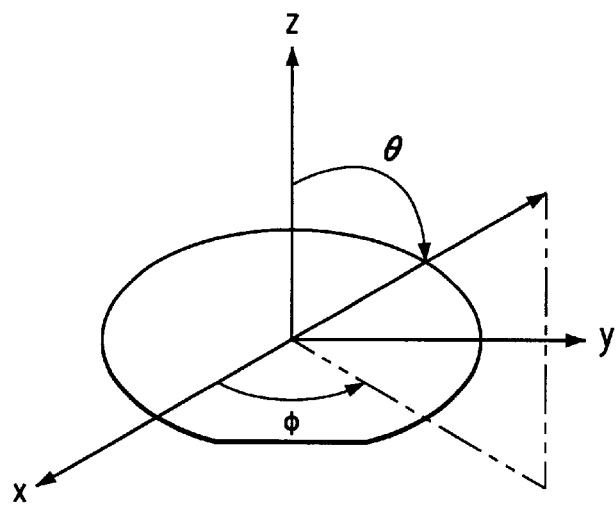
FIG. 2 illustrates a coordinate system which will be used to describe embodiments of the instant invention.
Figure 4D:
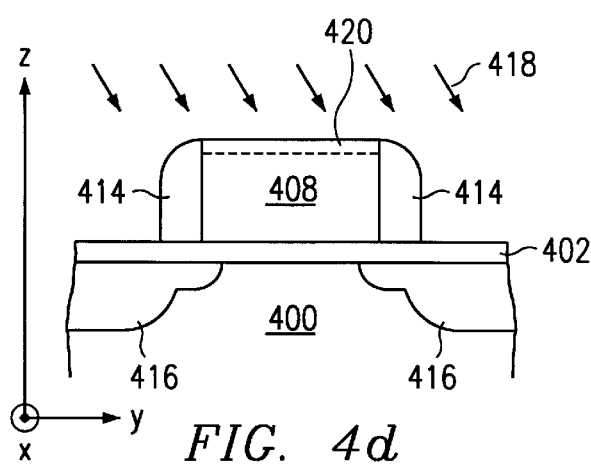

Referring to step 310 of FIG. 3 and FIG. 4d, the upper most portion of conductive gate structure is amorphized using the method of the instant invention. In one embodiment of the instant invention, this is accomplished by implanting an amorphizing substance, preferably Ge, Ar, Si, $BF_2$, or As, into gate structure 408 at an energy level (preferably around 30 keV if gate insulator 402 covers the source/drain regions and around 20 to 25 keV if it is removed in these areas) and dosage (preferably around $1 \times 10^{14}$ to $3 \times 10^{14}$) sufficient enough to cause the amorphization of around 10 to 50 nm (preferably on the order of 25 to 35 nm—more preferably around 30 nm) into the upper most surface of gate structure 408. Preferably, this implantation step is performed at an angle, θ (illustrated in FIG. 2). In the best case (one in which adjacent gate structures are not too close together), theta can be determined by the following equation:

$$\theta > \arctan(L/d)$$

where L is the average grain size of the material to be silicided, and d is the thickness of the layer to be silicided (for example the thickness of polycrystalline gate structure 408). However, since most devices are getting smaller and transistors are more densely laid-out, implantation angle, theta, is practically limited by the height of the gate structure and the distance the gate structures are between one another (measured from the edge of one conductive material, preferably polycrystalline silicon, to the other—designated as L'). Therefore, theta will most like be determined by:

$$7° \leq \theta \leq \arctan(L'/2d)$$

where L' is the distance from the edge of one conductive gate structure to the edge of the closest gate structure (preferably on the order of 0.35 microns or less), and d is the height of the conductive gate structure plus the height of the underlying gate insulator (preferably on the order of 0.25 microns or more). In one example of the instant invention, theta is around 25 degrees. Preferably, theta is given by $$\theta \approx \arctan(L'/2d)$$

In order to properly introduce the PAI dopant into the proper regions, either the wafer may be continuously rotated in the x-y plane, or it may be rotated in discrete step (for example, in four discrete steps such as at φ=0, 90, 180, and 270). The key advantage of rotating the wafer is that in the event that channeling does occur through a grain of the material to be silicided, this would happen only for a given angle, $\phi_0$, and with rotating the wafer this angle would only be available for the channeling to occur for only a fraction of the implant dose. Hence, as soon as the angle changes from $\phi_0$ there will be no channeling through that particular grain. Consequently, the amount of ions channeled through that particular grain is significantly lowered (as compared to the instance where there is no rotation of the wafer in the x-y plane).

The amorphous region is denoted as region 420 in FIG. 4d. In an alternative embodiment, moly, Ta, any noble gas, Si, $BF_2$, or B is implanted (at an angle, θ, as shown above) into the gate structure so as to amorphize the upper most surface of the gate structure. Generally, any substance may be used as the amorphizing agent, but, preferably, not substances that degrade the device (such as Cu or Fe). In another embodiment, the amorphization is performed on both the upper surface of the gate structure and the upper surface of the substrate in portions of the source and/or drain regions.

Figure 4E:
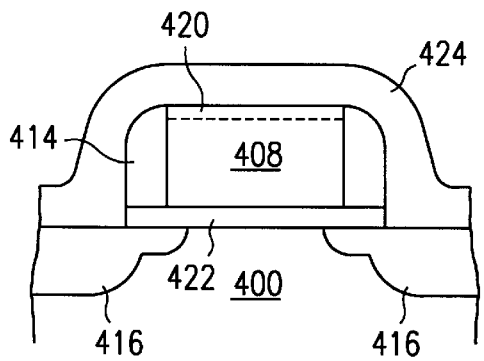

Referring to FIGS. 3 and 4e, in step 312, portions of insulating layer 402 may be etched so as to form gate insulator 422 and to expose source/drain regions. In an alternate embodiment, insulating layer 402 is not removed at this point. Next, metal 424 is deposited on gate structure 408 (in the region 420 where the gate structure is amorphous and where the moly resides from step 304. In addition, metal 424 (preferably titanium but it can also be comprised of tungsten, molybdenum, cobalt, nickel, platinum, or palladium) is formed on sidewall insulators 414 and the substrate over source/drain regions 416 (however, insulator 402 may be left above these regions so as to avoid the formation of a silicide over source/drain regions 416 in this step).

Figure 4F:
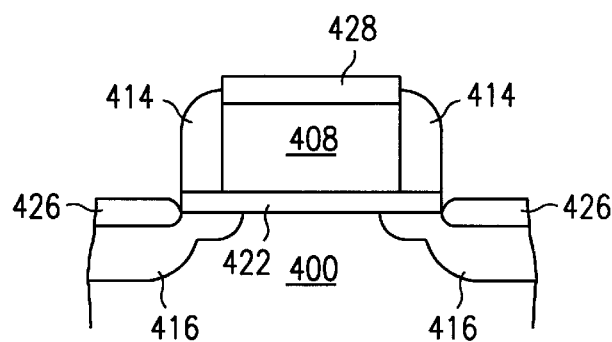

Referring to FIG. 3 and FIG. 4f, silicide regions 426 and 428 are formed in step 314. Silicided regions may be formed only on gate structure 408, only in source/drain regions 416, or in both. FIG. 4f depicts the formation of silicide regions 426 and 428 (on source/drain regions 416 and gate structure 408, respectively). Preferably, step 314 is comprised of reacting the metal with any underlying semiconductor regions by performing a silicide formation step at a temperature of around 700 to 780 C. Using the method of the instant invention, a second, high-temperature, anneal step may or may not be necessary to transform silicide regions 426 and 428 to their low resistivity phase (i.e. C54 phase for Ti) because, in the case where the silicide enhancing material is introduced into the gate structure, the low resistivity silicide will, likely, be formed directly on region 408 (after the deposition of the metal and the low temperature anneal discussed above).

Basically, the instant invention can be performed using at least two different embodiments with variations to each of these embodiments. In one embodiment, the gate structure is formed followed by the formation of the sidewall insulators and the lightly doped drain regions. Next, an anneal step is performed so as to activate the source/drain implants. Either the cap oxide is removed followed by the amorphization of the gate and the source/drain region, or the amorphization step is performed followed by the removal of the cap oxide. The metal is deposited, next, followed by a low temperature anneal and standard processing.

In all of these embodiments, a high temperature anneal may be performed after the low temperature anneal, which is used to react the Ti with the underlying silicon. Typically, the high temperature anneal step is used to convert the C49 phase silicide (formed with the Ti reacts with the Si in the low temperature anneal step) to the lower resistivity C54 phase silicide. However, if the silicide enhancing material is deposited in the polycrystalline silicon, the silicide formed using the instant invention is most likely all (or mostly) C54 phase silicide, this high temperature anneal step may or may not be performed. Preferably, this high temperature anneal step, if performed, will be at around 800 to 950 C.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of making a transistor having a silicided gate structure insulatively disposed over a semiconductor substrate which lies in an x-y plane, said method comprising the steps of:

forming a semiconductive structure having an active surface and insulatively disposed over a semiconductor substrate;

amorphizing a portion of said active surface of said semiconductive structure by introducing an amorphizing substance into said active surface of said semiconductive structure at an angle, theta, which is greater than seven degrees from a z-axis which is normal to the semiconductive structure active surface and at an angle capable of introduction into said surface;

then forming a metal layer on said active surface of said semiconductive structure; and forming a lower resistivity silicide on said semiconductive structure by interacting said metal layer with said semiconductive structure in said amorphized portion of said semiconductive structure.

2. The method of claim 1, wherein said semiconductive structure is comprised of a material selected from the group consisting of: doped polysilicon, undoped polysilicon, epitaxial silicon, and any combination thereof.

3. The method of claim 1, wherein said metal layer is comprised of a material selected from the group consisting of: titanium, Co, W, Mo, nickel, platinum, palladium, and any combination thereof.

4. The method of claim 1, further comprising the step of performing a low temperature anneal step after said step of forming a metal layer on said gate structure.

5. The method of claim 4, wherein said low temperature anneal step is comprised of subjecting said transistor to temperatures in excess of 600 C.

6. The method of claim 4, wherein said low temperature anneal step is comprised of subjecting said transistor to a temperature around 700 to 800 C.

7. The method of claim 1, wherein said amorphizing substance is comprised of a substance selected from the group consisting of: As, Ge, or any combination thereof.

8. A method of making a transistor having a silicided gate structure insulatively disposed over a semiconductor substrate which lies in an x-y plane and has a gate length, said method comprising the steps of:

forming a semiconductive structure having a thickness insulatively disposed over a semiconductor substrate;

amorphizing a portion of said semiconductive structure by introducing an amorphizing substance into said semiconductive structure at an angle, theta, which is greater than seven degrees from a z-axis which is normal to the semiconductor substrate;

forming a metal layer on said semiconductive structure;

and wherein said metal layer interacts with said semiconductive structure in said amorphized portion of said semiconductive structure so as to form a lower resistivity silicide on said semiconductive structure;

wherein said angle, theta, is determined by:

$$\theta > \arctan(L/d)$$

where L is the gate length of said transistor and d is the thickness of the semiconductive structure.

9. A method of making a transistor having a silicided gate structure insulatively disposed over a semiconductor substrate which lies in an x-y plane in an integrated circuit having at least one other gate structure at a distance from said silicided gate structure said silicided gate structure and said other gate structure having edges, said method comprising the steps of:

forming a semiconductive structure insulatively disposed over a semiconductor substrate;

amorphizing a portion of said semiconductive structure by introducing an amorphizing substance into said semiconductive structure at an angle, theta, which is greater than seven degrees from a z-axis which is normal to the semiconductor substrate;

forming a metal layer on said semiconductive structure;

and wherein said metal layer interacts with said semiconductive structure in said amorphized portion of said semiconductive structure so as to form a lower resistivity silicide on said semiconductive structure;

wherein said angle, theta, is determined by:

$$7° < \theta \text{ arctan} \leq (L'/d)$$

where L' is the shortest distance from an edge of one gate structure to an edge of the closest gate structure plus the height of the underlying gate insulator and d is the thickness of the semiconductive structure.

10. The method of claim 1, wherein said angle, theta, is around 25 degrees.

11. The method of claim 1, wherein said semiconductor substrate is rotated in the x-y plane during said step of introducing said amorphizing substance into said semiconductor structure.

12. The method of claim 11, wherein said semiconductor substrate is continuously rotated in the x-y plane during said step of introducing said amorphizing substance into said semiconductor structure.

13. The method of claim 11, wherein said semiconductor substrate is rotated in discrete steps in the x-y plane during said step of introducing said amorphizing substance into said semiconductor structure, said discrete steps having a step size.

14. The method of claim 13, wherein said step size is around 90 degrees.

15. The method of claim 13, wherein said step size is around 45 degrees.

16. A method of siliciding a structure comprised of a semiconductive material having an active surface situated over a semiconductor substrate, said method comprising the steps of:

providing a semiconductive material having an active surface over a semiconductor substrate;

amorphizing a portion of said semiconductive material by introducing an amorphizing substance into said semiconductive material at an angle, theta, which is greater than seven degrees from a z-axis which is normal to said semiconductive material active surface and at an angle capable of introduction into said semiconductor material active surface forming a metal layer on said semiconductive material; and said metal layer forming a silicide on said semiconductive material by interacting with said semiconductive material in the amorphized portion of said semiconductive material.

17. The method of claim 16, wherein said semiconductive structure is comprised of a material selected from the group consisting of: doped polysilicon, undoped polysilicon, epitaxial silicon, and any combination thereof.

18. The method of claim 16, wherein said metal layer is comprised of a material selected from the group consisting of: titanium, Co, W, Mo, nickel, platinum, palladium, and any combination thereof.

19. The method of claim 16, wherein said amorphizing substance is comprised of a substance selected from the group consisting of: As, Ge, or any combination thereof.

20. A method of siliciding a structure comprised of a semiconductive material situated over a semiconductor substrate, said method comprising the steps of:

amorphizing a portion of said semiconductive material by introducing an amorphizing substance into said semiconductive material at an angle, theta, which is greater than seven degrees from a z-axis which is normal to said semiconductive substrate;

forming a metal layer on said semiconductive material;

and wherein said metal layer interacts with said semiconductive material in the amorphized portion of said semiconductive material so as to form a silicide on said semiconductive material.

wherein said angle, theta, is determined by:

$$7° < \theta \text{ arctan} \leq (L'/d)$$

where L' is the shortest distance from an edge of one structure to an edge of the closest structure and d is the height of the semiconductive material.

* * * * *